(12) United States Patent
Gebreselasie et al.

(10) Patent No.: US 9,568,538 B1
(45) Date of Patent: Feb. 14, 2017

(54) MATCHING OF BIPOLAR TRANSISTOR PAIR THROUGH ELECTRICAL STRESS

(71) Applicant: International Business Machines Corporation, Armonk, NY (US)

(72) Inventors: Ephrem G Gebreselasie, South Burlington, VT (US); Alain Loiseau, Williston, VT (US); Joseph M Lukaitis, Pleasant Valley, NY (US); Richard Antoine Poro, Pittsford, VT (US); Andreas Daniel Stricker, Milpitas, CA (US); Kimball Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/919,698

(22) Filed: Oct. 21, 2015

(51) Int. Cl.
*H03K 5/24* (2006.01)
*G01R 19/04* (2006.01)
*G01R 31/26* (2014.01)

(52) U.S. Cl.
CPC ................................. *G01R 31/2608* (2013.01)

(58) Field of Classification Search
USPC ......... 327/50, 53, 58, 62, 90, 512, 513, 538, 327/541; 324/522–523; 323/315, 317
See application file for complete search history.

(56) References Cited

U.S. PATENT DOCUMENTS

| | | | |
|---|---|---|---|
| 6,157,244 A | 12/2000 | Lee et al. | |
| 6,677,808 B1 | 1/2004 | Sean et al. | |
| 7,115,466 B2 | 10/2006 | Welser et al. | |
| 7,218,169 B2* | 5/2007 | Bhattacharya | G05F 3/247 327/512 |
| 7,236,015 B2* | 6/2007 | Eberlein | H03F 3/45 327/65 |
| 7,345,327 B2 | 3/2008 | Welser et al. | |
| 8,373,491 B2* | 2/2013 | Van Den Bos | G05F 3/262 323/315 |
| 8,378,735 B2 | 2/2013 | Pereira Da Silva, Jr. et al. | |
| 2012/0319243 A1 | 12/2012 | Fan et al. | |

FOREIGN PATENT DOCUMENTS

| | | |
|---|---|---|
| CN | 103105506 A | 5/2013 |
| WO | WO2006102324 A2 | 9/2006 |

\* cited by examiner

*Primary Examiner* — An Luu
(74) *Attorney, Agent, or Firm* — Jeffrey S LaBaw; Steven J Meyers

(57) ABSTRACT

A method for matching a pair of matched bipolar transistors in an integrated circuit is disclosed. Within a device, it is determined which transistor is a correctable transistor of the pair of bipolar transistors. The correctable transistor is the transistor of the pair of bipolar transistors having a chosen characteristic which when electrically stressed will converge with a chosen characteristic of the other transistor of the pair of bipolar transistors. The pair of bipolar transistors are matched by electrically stressing the correctable transistor of the bipolar transistors.

20 Claims, 6 Drawing Sheets

MATCHING OF BIPOLAR TRANSISTOR PAIR THROUGH ELECTRICAL STRESS

BACKGROUND OF THE INVENTION

Technical Field

This disclosure relates to integrated circuit devices, and more specifically, to matching of a bipolar transistor pair through electrical stress.

Background of the Related Art

In modern integrated circuitry in semiconductor chips, there are many circuits which depend upon a matched pair of transistors. Matched transistor pairs are utilized in differential and instrumentation amplifiers, logarithmic amplifiers and comparators. Another type of circuit using matched transistor pairs is a class of circuit called a current mirror. A current mirror is a circuit designed to copy a current through one active device by controlling the current in another active device of a circuit, keeping the output current constant regardless of loading.

Current mirrors using bipolar junction transistors, or more commonly bipolar transistors, depend on accurate matching of the characteristics of the bipolar pair used in the circuit. One of the more important characteristics is Vbe. Vbe is the voltage that falls between the base and emitter of a bipolar transistor. One example of a mirror circuit using matched bipolar transistors is a Wilson current mirror. A Wilson current mirror is a three-terminal circuit that accepts an input current at the input terminal and provides a "mirrored" current source or sink output at the output terminal.

Due to manufacturing tolerances, the bipolar transistors possess a variation in Vbe and other characteristics. To achieve good current mirroring, the Vbe of both transistors should be matched within a certain accuracy. In the prior art, to compensate for transistor mismatch, circuits usually use an electrical compensation or tuning method to match the currents of the two bipolar transistors used in a mirror. These methods use some sort of electrical circuit to compensate for the Vbe mismatch.

BRIEF SUMMARY

According to this disclosure, a method for matching a pair of matched bipolar transistors in an integrated circuit is disclosed. Within a device, it is determined which transistor is a correctable transistor of the pair of bipolar transistors. The correctable transistor is the transistor of the pair of bipolar transistors having a chosen characteristic value which when electrically stressed will converge to a chosen characteristic value of the other transistor of the pair of bipolar transistors. The pair of bipolar transistors are matched by electrically stressing the correctable transistor of the bipolar transistors.

In another aspect of the invention, a circuit including a pair of matched bipolar transistors also includes a connection means for isolating each transistor of the pair of matched bipolar transistors. The circuit also includes a control circuit for testing and electrically stressing an isolated transistor to change a chosen characteristic of the isolated transistor.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

At a high level, the invention tunes the circuit by electrically stressing one of a pair of transistors.

More particularly, the process begins by comparing the properties of each transistor for a chosen characteristic such as Vbe or base voltage to determine whether they match. If not, a set of stress parameters are consulted.

The stress parameters include parameters such as stress time, voltage (for stressing), current (for stressing) or temperature and include a change in the chosen characteristic given the stress parameters for a model of the transistors in the integrated circuit. The comparison of the transistors determines which one of the transistors needs to be stressed, since stressing the transistor will change the chosen characteristics in a particular direction. For the purposes of the invention, the transistor which can be changed so that the values of the chosen characteristic for the pair of transistors converge or match within acceptable tolerances is called the "correctable" transistor. The comparison also generates a set of required conditions to achieve the desired shift as smaller differences between the two transistors will require less stressing of the correctable transistor. Next, the process isolates the correctable transistor and applies electrical stress to drift the correctable transistor to the desired state, i.e. matching the characteristics of the other transistor. Then, the process reconnects the newly matched transistor with the rest of the circuit.

Figure 1:
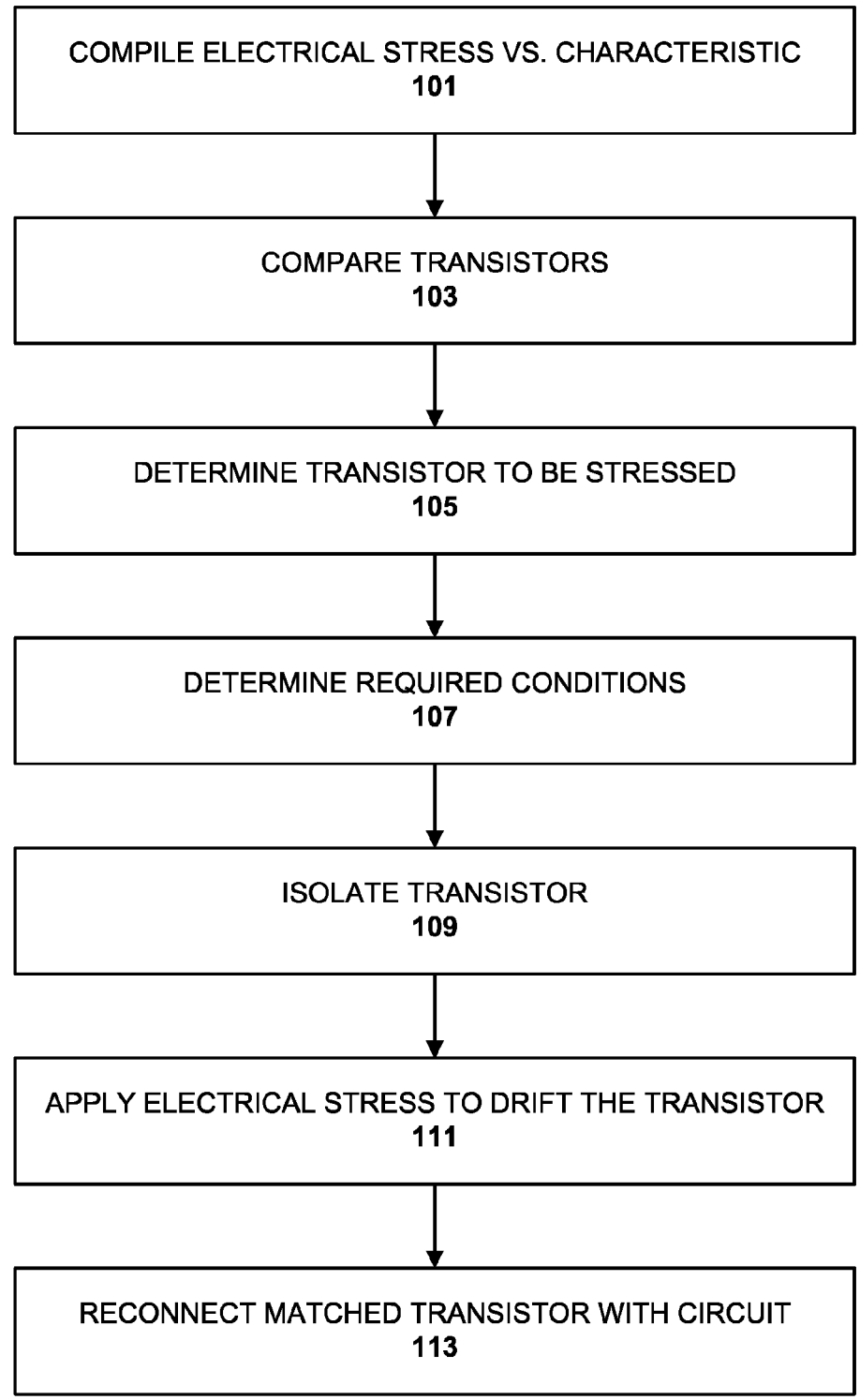
FIG. 1 is a high level flow diagram of a first embodiment of the invention.

FIG. 1 is a high level flow diagram of the general process of the invention. In step 101, the process begins by compiling a set of stress conditions for at least the chosen characteristic. In one preferred embodiment, this step is performed in the semiconductor fabrication facility (a fab) in which the transistors are first designed and characterized. These conditions would then be published to circuit designers and other customers of the fab so they could be used in circuit design and correction. It is likely that there are several different transistor designs, e.g., different dimensions, created by different process conditions, etc., each of which may have a different model for the stress conditions.

Further, the stress conditions are likely to be a small part of the characterization data which the fab provides to the customer for each of the transistors.

The characterization process can be accomplished in many ways. One embodiment is described below. For each parameter that could be a "chosen" characteristic, e.g., Vbe, base voltage, transistor gain, and for each transistor to be modelled, the stress parameters needed to accomplish a change in the chosen characteristic are observed by measurement. Because using an electrical stress will heat a transistor, the stress parameters are observed at a plurality of temperatures, e.g., room temperature, 80 degrees C., 130 degrees C., so that a temperature correction can be performed. So given a simplified example of three transistors, Transistor A, Transistor B and Transistor C, tested over three different stressing current levels (and/or voltage levels) over three different temperatures and assuming that the potential chosen characteristics can be measured concurrently, there would be twenty seven sets of process conditions to be measured. Obviously, the tests can be repeated with different runs of transistors to give more data and an idea of how repeatable the process and the stress conditions may be. The characterization data is used to provide a set of models for each transistor, temperature and stress conditions for each of the chosen characteristics. The models are created by using the stress condition data and fitting a curve using interpolation, smoothing or regression analysis to the data points. In some preferred embodiments, the model can be a curve which best fits the collected data. In other preferred embodiments of the invention, the model can be an algorithm which calculates the electrical stress conditions given a difference of or the two values of the chosen characteristic for each transistor.

The chosen characteristic can vary according to the technology. For example, in bipolar transistor technology, the parameters, Vbe, base voltage and transistor gain are most likely to be the "chosen" characteristic to be matched between the transistors. So the characterization data from the fab should compile models for those characteristics.

The stress condition models are then used in the subsequent steps which take place on the actual transistor pair to be corrected. In step 103, the process compares the values of the transistor pair for the chosen characteristic. For example, for a bipolar transistor pair, the Vbe values for each transistor pair can be selected as the chosen characteristic. If so, the Vbe values are measured for each of the transistors.

By the comparison, in step 105, it is determined which transistor can be electrically stressed so that the chosen characteristic can match within the predetermined tolerances. For each of the candidate chosen characteristics, the electrical stress will raise or lower the value of the characteristics for the transistor. For a characteristic which increases with electrical stress, like Vbe or base voltage, the transistor with the lower value is determined to be the "correctable" transistor. For a characteristic which decreases with electrical stress like transistor gain, the transistor with the higher value is the correctable transistor.

Stressed transistors will not keep their shifted characteristics in all technologies. This invention applies to a technology where the parameters can be shifted by electrical stress and where they will stay shifted for a usable time or over the lifetime of the product.

The "acceptable tolerances" for Vbe, base voltage and transistor gain will vary according to technology and the fab manufacturing standards. A spec of roughly +/−2 mV for Vbe matching, is equivalent to approximately an 8% current difference (60 mV per decade so $10^{\wedge}(2\text{ mV}/60\text{ mV})=1.08$).

By using the invention, tighter tolerances could be achieved, for example, stressing away 1 mV of difference in Vbe, which would be approximately a 4% current difference.

It is noted that the other transistor in the pair could be stressed as well as its value for the chosen characteristic would change, too. However, that would defeat the purpose of the invention (unless the "correctable" transistor was changed more) as the purpose which the invention seeks to address is to match the transistor pair by electrical stress. If the other transistor was stressed, and not the correctable transistor, the mismatch between the two transistors would become greater.

In step 107, once the correctable transistor is determined, the electrical stress conditions required to be applied to the correctable transistor are determined. In the preferred embodiment, this is accomplished by reference to models created by the fab as described above. Typically, conditions for the electrical stress process will have a certain stress current or stress voltage to be applied to the transistor for an amount of time needed to shift the value of the chosen characteristic for correctable transistor the needed amount so that the transistor pair matches. Temperature and other process conditions are optionally part of the model. For example, if a 1% change in Vbe is required, applying a stress according to model 3 of FIG. 5 for a couple of seconds would achieve this. However, if a 10% shift is required, then applying a stress according to model 1 for a few seconds would be more appropriate. One skilled in the art would appreciate that the optimal electrical stress conditions will likely vary according to the transistor dimensions and processes used to create the transistors.

Next, in step 109, the transistor which needs to be stressed is isolated from the rest of the integrated circuit. As will be discussed below, in one preferred embodiment, this step is accomplished by designing a set of switches which can be turned on and off during testing and electrical stress processes. For the purposes of the invention, a switch is a device in a circuit which can connect or disconnect another portion of the circuit from an electrical current or voltage. In preferred embodiments of the invention, the switch can be a transistor or portion thereof, but those skilled in the art would recognize that alternative devices can be employed in alternative embodiments of the invention. A control circuit is used to apply test and stress voltages and/or currents to the appropriate transistor.

The process applies electrical stress to change the chosen characteristic in the correctable transistor in step 111. During the electrical stress process, the current and/or voltages used will likely be several times, if not an order of magnitude, higher than the voltages and currents used during normal operation of the device. An order of magnitude is a good relative example for the stress current. A smaller factor might be used for stress voltage, e.g., 1.5 to 2 times the normal voltage could be used.

Finally, in step 113, the matched transistor is reconnected with the integrated circuit. In the preferred embodiment, the switches built into the circuit are now changed to the normal operating condition by means of the control circuit. In the preferred embodiment, the switches are transistors which can be activated by the control circuit. In some preferred embodiments, tests are performed to determine whether the chosen characteristic has been successfully matched in the transistor pair. If not, in these embodiments, then the electrical stress process is repeated for the correctable transistor for the new difference in the chosen characteristic according to the model.

Figure 2A:
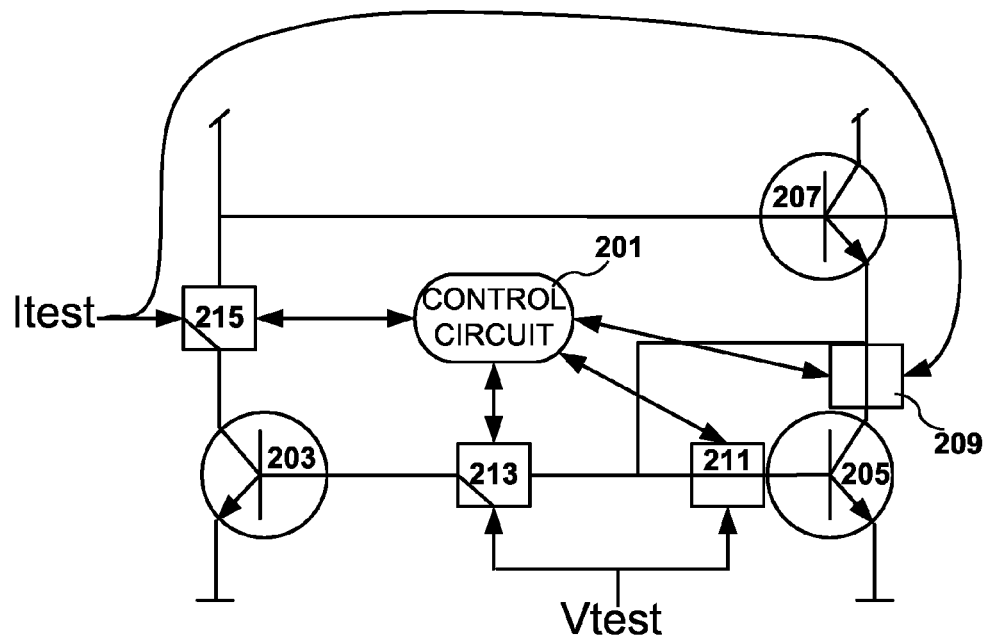
FIGS. 2A and 2B are diagrams of a circuit for testing and electrically stressing one of the transistors in a transistor pair according to a first embodiment of the invention.
Figure 2B:
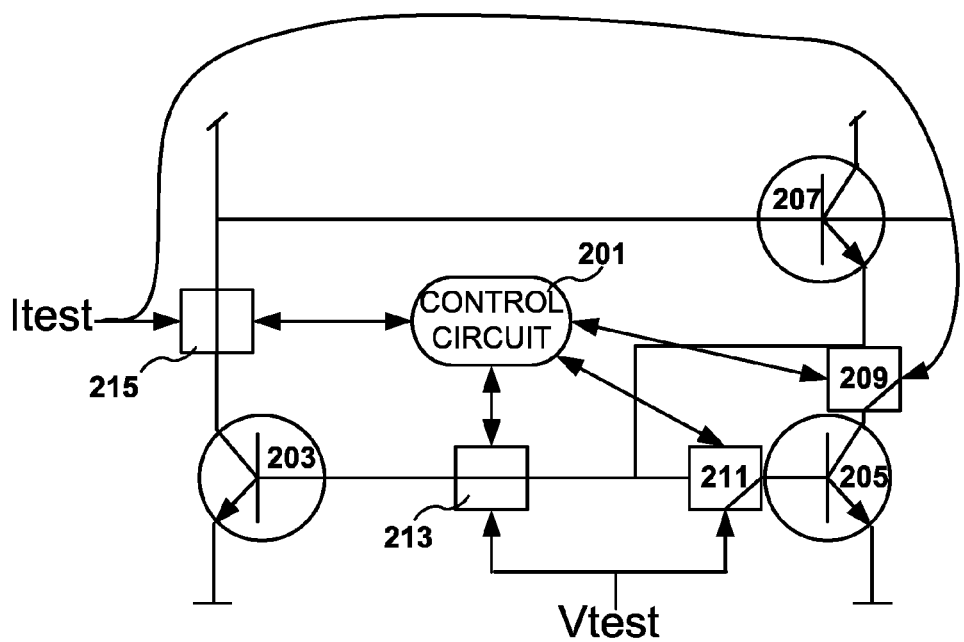

FIGS. 2A and 2B show a control circuit being used to test a Wilson current mirror for matching the Vbe for bipolar transistors. As shown, in the figures, control circuit 201 is used to test the bipolar transistor pair 203 and 205 by changing the settings on switches 209, 211, 213 and 215. In FIG. 2A, the left side transistor 203 is being measured by flipping switches 209 and 211 to the "off" position and switches 213 and 215 to the "on" position so that the test current, Itest, and the test voltage, Vtest, are respectively applied to the collector and base of the transistor 203. Similarly, in FIG. 2B, the right side transistor 205 is being measured by flipping switches 209 and 211 to the "on" position 213 and 215 to the "off" position so that the test current, Itest, and the test voltage, Vtest, are respectively applied to the collector and base of the transistor 205. Current and voltage sources are respectively connected to the set of switches to provide the test and stress currents and the test and stress voltages.

To test for Vbe for each transistor, the following procedure is followed. The test current, Itest, is forced to an established test current level. The test voltage, Vtest, is ramped until the collector voltage drops. For example, when Vc<Vb, the value for Vbe is established. Next, Vbe_left and Vbe_right are compared at the collector voltage drop value. If these values are within an acceptable tolerance, the transistors can be considered matched and no further processing is needed. However, if the Vbe values are not acceptably close, it must be determined whether the left transistor 203 needs to be stressed or the right transistor 205 needs to be stressed.

The control circuit needs to establish logic signals to control the switches. It also needs to be able to provide the needed test current and test voltage, Itest and Vtest, as well as the needed stress current and stress voltage, Istress and Vstress. Also, the control circuit needs to be able to sense the collector voltage to define Vbe. In one preferred embodiment, a shared control circuit is used to test and stress multiple devices to save integrated circuit footprint. The switches would have to be off for all of the devices, except for the one device that is currently being measured or stressed.

Figure 3A:
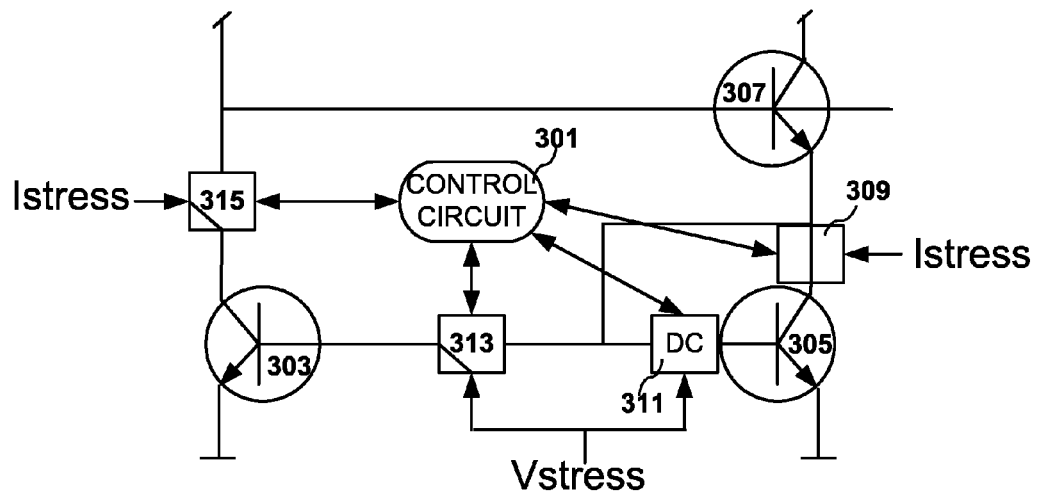
FIGS. 3A and 3B are diagrams of a circuit for electrically stressing one of the transistors in a transistor pair according to a second embodiment of the invention.
Figure 3B:
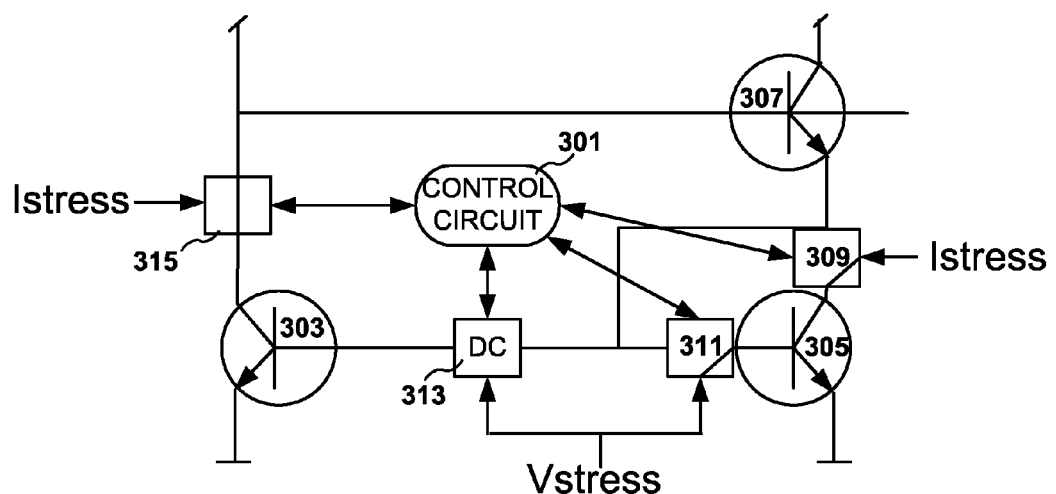

FIGS. 3A and 3B show a control circuit being used to stress a Wilson current mirror so that the Vbe for bipolar transistor pair is matched. Note that both transistors are tested as shown in FIGS. 2A and 2B, however, only one of the transistors will be stressed. In FIG. 3A, it has been determined that the left side transistor 303 is the correctable transistor so it is being stressed by flipping switches 309 and 311 to the "off" or "don't care" (DC) position and switches 313 and 315 to the "on" position so that the stress current, Istress, and the stress voltage, Vstress, are respectively applied to the collector and base of the transistor 303. Similarly, in FIG. 3B, it has been determined that the right side transistor 305 is the correctable transistor so it is being stressed by flipping switches 309 and 311 to the "on" position 313 and 315 to the "off" or "don't care" position so that the stress current, Istress, and the stress voltage, Vstress, are respectively applied to the collector and base of the transistor 305. The values for Istress and Vstress are established by reference to the electrical stress conditions determined by the semiconductor fab for the transistors in the mirror circuit, and are typically much higher than the normal operating conditions of the circuit. This process would be repeated across the integrated circuit, either by using a control circuit which is dedicated to the device or a shared control circuit which tests and stresses multiple devices.

Figure 4:
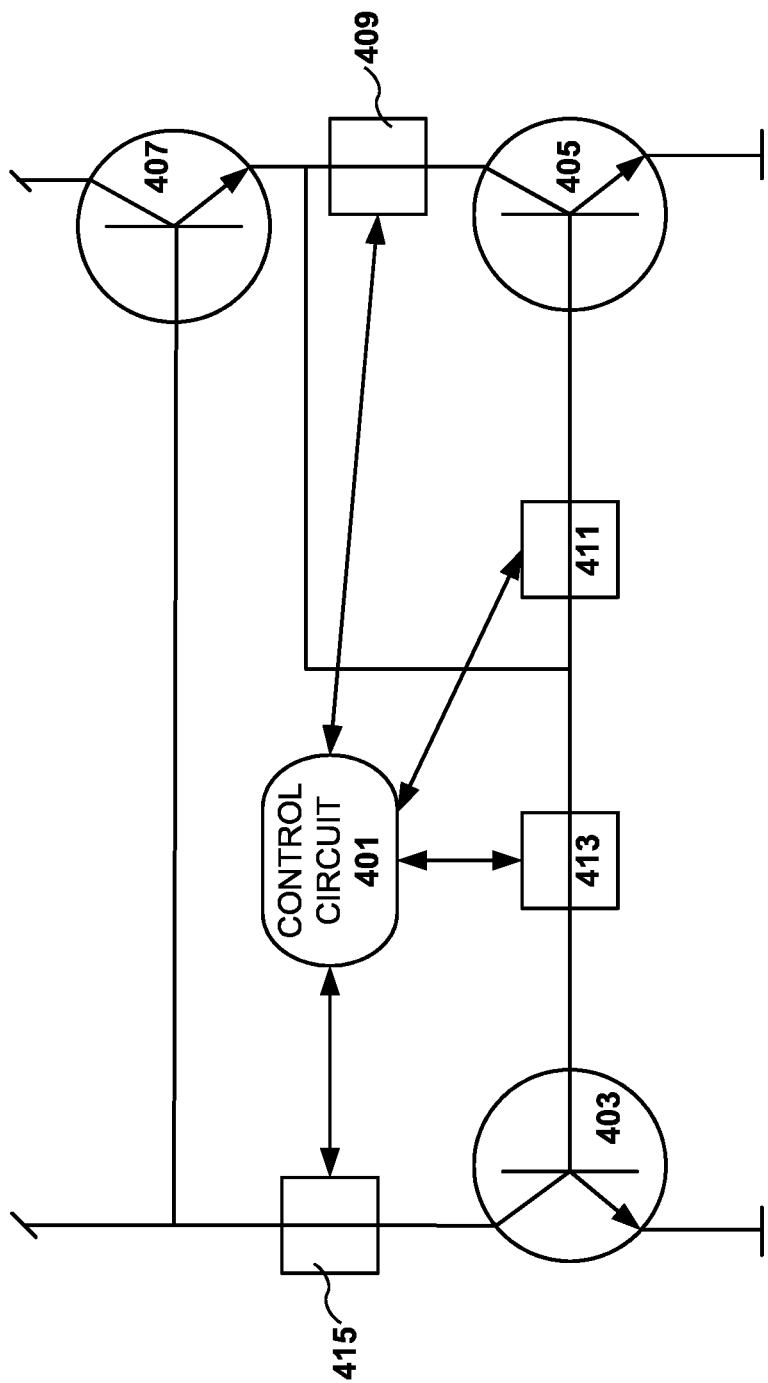
FIG. 4 is a diagram of the circuit after electrical stressing in normal operation according to a first embodiment of the invention.

FIG. 4 shows the Wilson current mirror circuit in normal operation. Here, the transistor pair 403 and 405 have been matched to acceptable tolerances using the electrical stress process of the present invention. The transistors in the switches 409, 411, 413 and 415 are connected to the other devices in the standard Wilson current mirror configuration.

In one embodiment of the invention, the invention can be used after normal operation of the device occurs to adjust a developing mismatch between the transistors. That is, where the pair of transistors are initially matched within the manufacturing standards, but for some reason age differently and become mismatched. If the transistors have this tendency, then doing a regular "refresh" of the matching would be beneficial.

The Wilson current mirror is but one example of a circuit in which a matched pair of transistors is useful. In addition to other types of current mirrors, matched transistor pairs are utilized in differential and instrumentation amplifiers, logarithmic amplifiers and comparators. The present invention would be useful matching transistor pairs for all these types of circuits.

Figure 5:
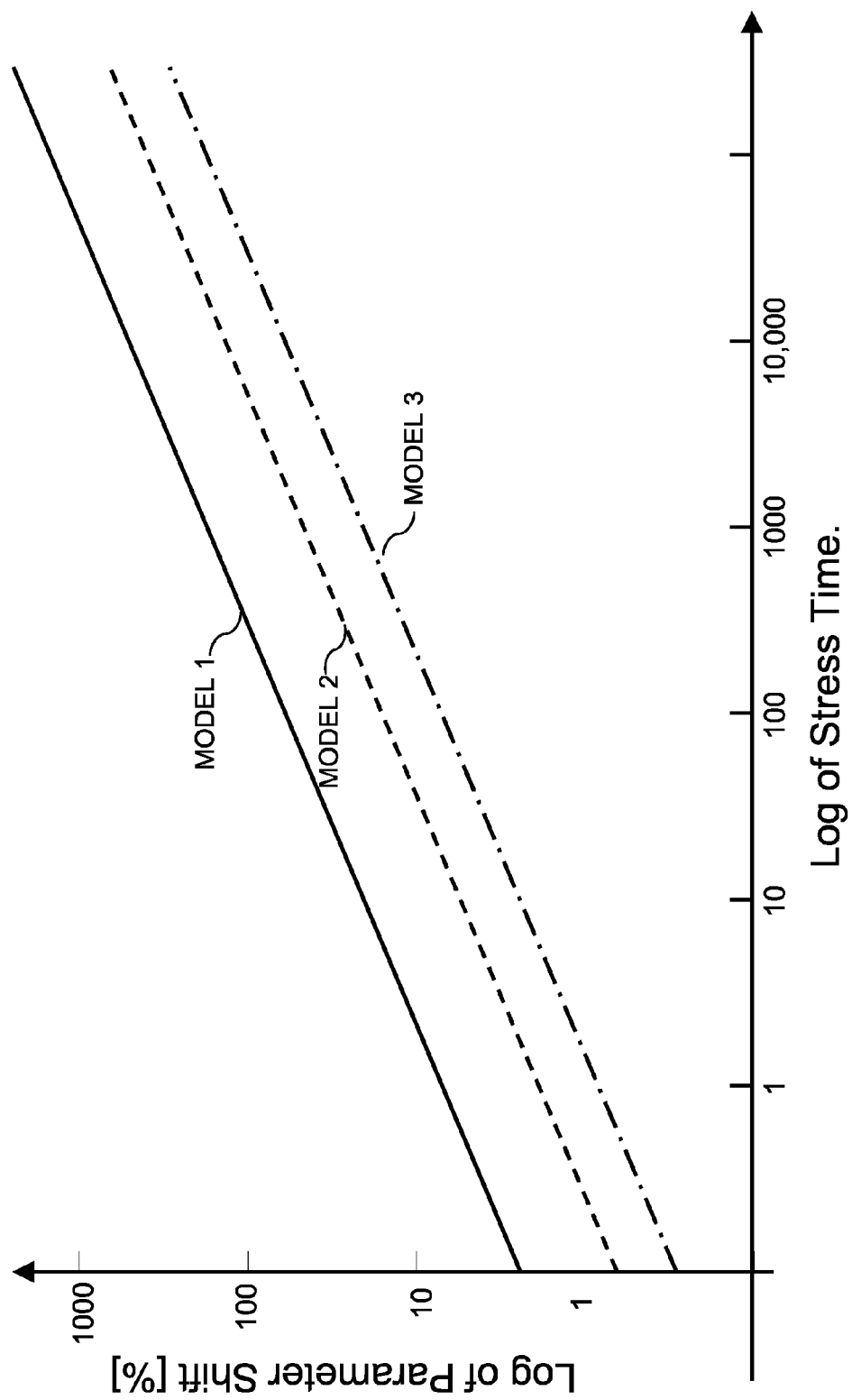
FIG. 5 is a graph showing the several models for electrically stressing a transistor according to a first embodiment of the invention.

FIG. 5 is a generalized graph of three transistor models showing a parameter shift of a chosen characteristic given an amount of stress time. FIG. 5 shows the amount of shift induced to a transistor similar to the transistors used in the matched pair, when submitted to an electrical stress as a function of the stress time. Three curves are given for three different stress conditions, e.g., different stress voltages, stress currents, etc. As mentioned above, the chosen characteristic can be the Vbe of the bipolar transistor, but can be any parameter that needs to be matched. For example, other chosen characteristics could be a collector current at a given Vbe, a gain of the transistor or a base current.

In the preferred embodiment, the transistor model is based upon data taken on a representative sample of circuits fabricated by the semiconductor fab. It is not necessary for the model to be based on measurements taken on the integrated circuit containing the matched transistor pair that is later electrically stressed to be matched using the processes of the present invention. This type of curve shown in the drawing, i.e. a straight line on a logarithmic plot, is typical of the models for many transistors. However, it is not the only type of curve which can be used model the chosen characteristic.

The point at which the electrical stress becomes destructive to the circuit is usually determined by a reliability team. So the selected stress conditions will preferably be bounded by a maximum current and a maximum voltage and a maximum stress time (to minimize expense) to produce a certain change in the chosen characteristic. Thus, the stress testing may be conducted and the model created in view of these boundary conditions.

Figure 6:
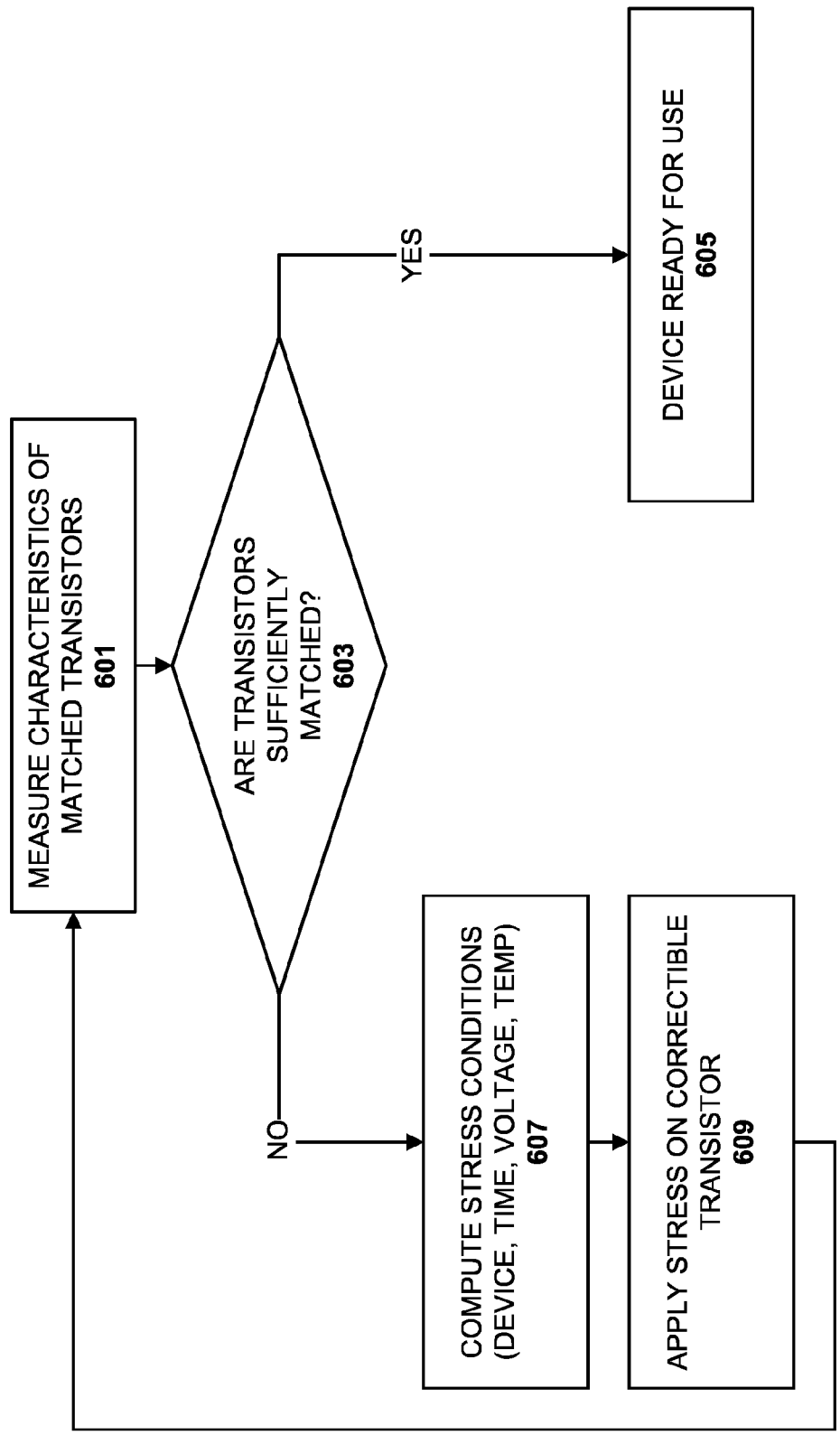
FIG. 6 is a flow diagram of another embodiment of the invention.

In FIG. 6, an alternative embodiment of the invention is shown. In step 601, the characteristics of the transistor pair are measured. If in step 603, the chosen characteristic(s) are sufficiently matched, then the device is ready for use, step 605. In this embodiment of the invention, a plurality of chosen characteristics may be selected and tested for a match within established tolerances. If the transistors are not sufficiently matched, in step 607, the stress conditions, e.g., which device, time of electrical stress, stress voltage, stress current, temperature, are established or otherwise calculated. The stress conditions can be established according to the fab models or according to an algorithm. In this embodiment, since it is possibly iterative, a set of stress conditions can be conservative for a first pass. In this way, the transistors can be matched in a step-wise fashion so that the chosen characteristic value in the correctable transistor is matched, but not exceeded. Then in step 609, the stress conditions are applied to the correctable transistor. The process returns to step 601 to determine whether the transistors were sufficiently matched by the electrical stress. If so, the device is ready for use, and the process ends in step 605. If not, the electrical stress is again applied to the correctable transistor, and the process iterates until the transistor pair is matched.

The iterative approach can be used in situations when the transistors have not been completely characterized at the fab or when such information is unavailable.

The invention has several benefits over the prior art. Complicated compensation circuitry is not necessary. Devices can be burned in by manufacturer and are then stable over a certain temperature and time range. Transistors which age differently over time can be tuned so that they match. A shared control circuit can minimize the added integrated circuit footprint as compared to the prior art compensation circuitry.

While only one or a limited number of features are illustrated in the drawings, those ordinarily skilled in the art would understand that many different types features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for matching a pair of matched bipolar transistors in an integrated circuit comprising:
   determining a correctable transistor of the pair of matched bipolar transistors; and
   matching the pair of bipolar transistors by electrically stressing the correctable transistor of the matched bipolar transistors, wherein the correctable transistor is a first transistor of the pair of matched bipolar transistors having a chosen characteristic value which when electrically stressed will converge to a chosen characteristic value of a second transistor of the pair of matched bipolar transistors.

2. The method as recited in claim 1 wherein the determining comprises comparing values for the chosen characteristic for each transistor of the two matched bipolar transistors of the pair during a testing phase.

3. The method as recited in claim 1 wherein the matching comprises an iterative process that is used to achieve a match for the chosen characteristic within acceptable tolerances for the pair of matched bipolar transistors.

4. The method as recited in claim 1, further comprising starting normal circuit operation after the matching.

5. The method as recited in claim 1, wherein the determining and matching are performed in between phases of normal circuit operation.

6. The method as recited in claim 1, wherein the chosen characteristic is Vbe for each of the transistors in the pair of matched bipolar transistors.

7. A method for matching a pair of matched bipolar transistors in an integrated circuit comprising:
   providing a set of compiled changes in a chosen characteristic for a first bipolar transistor given a set of electrical stress conditions to produce a model;
   comparing values of the chosen characteristic for each of the bipolar transistors in the pair;
   determining which transistor of the pair of matched bipolar transistors is a correctable transistor;
   electrically isolating the correctable transistor;
   applying electrical stress to change the chosen characteristic of the correctable transistor according to the model; and
   electrically reconnecting the correctable transistor with the integrated circuit.

8. The method as recited in claim 7, wherein the chosen characteristic is Vbe for each of the transistors in the pair of bipolar transistors.

9. The method as recited in claim 7, wherein the changes in the first bipolar transistor are compiled in a first semiconductor fabrication facility and the comparing, determining, electrically isolating, applying electrical stress and electrically reconnecting are performed in a second semiconductor fabrication facility.

10. A circuit, comprising:
a pair of matched bipolar transistors;
a set of switches for isolating each transistor of the pair of matched bipolar transistors; and
a control circuit for testing and electrically stressing an isolated transistor to change a chosen characteristic of the isolated transistor.

11. The circuit as recited in claim 10, wherein the set of switches allows the isolated transistor to be reconnected after testing for normal operation of the pair of matched transistors.

12. The circuit as recited in claim 10, wherein the set of switches are a set of transistors which allow each transistor in the pair of transistors to be selectively isolated from and connected to other devices in the circuit.

13. The circuit as recited in claim 10, wherein current and voltage sources are connected to the set of switches.

14. The circuit as recited in claim 13, wherein the control circuit controls the set of switches to allow a test mode, a stress mode and a normal operation mode.

15. The circuit as recited in claim 13, wherein the circuit is a current mirror.

16. The circuit as recited in claim 13, wherein the circuit is selected from the group consisting of a differential amplifier, an instrumentation amplifier, a logarithmic amplifier and a comparator.

17. The circuit as recited in claim 10, wherein the circuit includes a plurality of pairs of matched bipolar transistors and the control circuit is electrically connected to each transistor of the plurality of matched bipolar transistors to test and electrically stress an isolated transistor within each pair of matched bipolar transistors to change a chosen characteristic of the isolated transistor within each pair of matched bipolar transistors.

18. The circuit as recited in claim 10, wherein the control circuit is also for determining which transistor with the pair of matched bipolar transistors is a correctable transistor, so that the electrical stressing can be performed on the correctable transistor.

19. The circuit as recited in claim 10, wherein the chosen characteristic is Vbe for each of the transistors in the pair of bipolar transistors.

20. The circuit as recited in claim 15, wherein the current mirror is a Wilson current mirror.

* * * * *